United States Patent
Bussmann-Holder et al.

(10) Patent No.: US 11,022,827 B2
(45) Date of Patent: Jun. 1, 2021

(54) MAGNETO-OPTICAL LIGHT MODULATOR

(71) Applicant: MAX-PLANCK-GESELLSCHAFT ZUR FÖRDERUNG DER WISSENSCHAFTEN E.V., Munich (DE)

(72) Inventors: Annette Bussmann-Holder, Böblingen (DE); Jürgen Köhler, Leonberg (DE); Gennady Logvenov, Stuttgart (DE); Arndt Simon, Stuttgart (DE); Krystian Roleder, Chozów (PL)

(73) Assignees: MAX-PLANCK-GESELLSCHAFT ZUR FÖRDERUNG DER WISSENSCHAFTEN E.V., Munich (DE); University of Silesia, Katowice (PL)

( * ) Notice: Subject to any disclaimer, the term of this patent is extended or adjusted under 35 U.S.C. 154(b) by 91 days.

(21) Appl. No.: 16/327,434

(22) PCT Filed: Aug. 22, 2017

(86) PCT No.: PCT/EP2017/071105
§ 371 (c)(1),
(2) Date: Feb. 22, 2019

(87) PCT Pub. No.: WO2018/041666
PCT Pub. Date: Mar. 8, 2018

(65) Prior Publication Data
US 2019/0196232 A1 Jun. 27, 2019

(30) Foreign Application Priority Data
Sep. 2, 2016 (EP) .................................. 16187081

(51) Int. Cl.
*G02F 1/09* (2006.01)
*C30B 29/24* (2006.01)
(Continued)

(52) U.S. Cl.
CPC .............. *G02F 1/092* (2013.01); *C30B 29/24* (2013.01); *G02F 1/0036* (2013.01); *G02F 1/0136* (2013.01); *G02F 1/09* (2013.01)

(58) Field of Classification Search
CPC .......... G02F 1/09; G02F 1/093; G02F 1/0036; G02F 1/092; G02F 1/0136; B82Y 20/00; C30B 29/24
(Continued)

(56) References Cited

U.S. PATENT DOCUMENTS 3,586,415 A * 6/1971 Kumda ...................... G02F 1/05
359/251
5,085,503 A * 2/1992 Osugi .................... G02F 1/0338
359/246
(Continued)

FOREIGN PATENT DOCUMENTS

WO 2015008553 A1 1/2015

OTHER PUBLICATIONS

International Search Report and Written Opinion corresponding to PCT/EP2017/071105, dated Jan. 2, 2018, 10 pages.

*Primary Examiner* — Mohammed A Hasan
(74) *Attorney, Agent, or Firm* — Harness, Dickey & Pierce, P.L.C.

(57) ABSTRACT

The invention relates to a magneto-optical light modulator (100) for modulating light based on a physical property provided as an input to the modulator (100), the modulator (100) comprising a substrate (114) with a region of material (130) comprising a film of $Eu_{(1-x)}Sr_{(x)}MO_3$ (112), an optical waveguide (106; 108) adapted for directing light through the region of material (130) and a first control unit, the first control unit being adapted to—maintain the region of material (130) at a constant predefined temperature in case the physical property is an input magnetic field subject to the region of material (130) or—maintain the region of material (Continued)

(130) subjected to a constant predefined magnetic field in case the physical property is an input temperature of the region of material (130), the light modulator (100) being adapted to perform the modulation of the light using the birefringence of the region of material (130), the birefringence depending on the physical property.

17 Claims, 10 Drawing Sheets

(51) Int. Cl.
*G02F 1/00* (2006.01)
*G02F 1/01* (2006.01)

(58) Field of Classification Search
USPC .......................................................... 359/280
See application file for complete search history.

(56) References Cited

U.S. PATENT DOCUMENTS

| | | | |
|---|---|---|---|
| 6,243,193 B1 * | 6/2001 | Katsuragawa | G02F 1/0018 359/280 |
| 2006/0146328 A1 * | 7/2006 | Decitre | G01N 21/21 356/369 |
| 2011/0096338 A1 | 4/2011 | Fukushima | |
| 2014/0001424 A1 | 1/2014 | Shimada | |

* cited by examiner

MAGNETO-OPTICAL LIGHT MODULATOR

CROSS REFERENCE TO RELATED APPLICATIONS

This application is a U.S. National Phase of PCT/EP2017/071105, filed on Aug. 22, 2017, which claims priority pursuant to European Patent Application No. 16187081.1 filed on Sep. 2, 2016, each of which is hereby incorporated by reference in its entirety.

TECHNICAL FIELD

The invention relates to a magneto-optical light modulator, a magnetic field sensor, a temperature sensor, a signal processor, a memory device, a method for reading a memory device and a computer program product.

BACKGROUND AND RELATED ART

Magneto-optical devices can be useful for a different variety of applications including optical switches, sensors and logic devices for optical computing. Various magneto-optical effects have been explored and various attempts have been made in the past to enhance the effect in order to make it industrially applicable in easily available temperature ranges and applied magnetic fields.

For example, U.S. Pat. No. 6,243,193 B1 discloses a magneto-optical light modulator that includes a first polarizer, a transparent magneto-optical component including a magneto-optical film deposited on a surface of a substrate, and a second polarizer. The surface of the substrate includes features having a depth in a range of 0.1 μm to 5 μm. Side surfaces of the features are covered with the magneto-optical film to a thickness of 5 nm to 200 nm. Light flux from a light source passes through the first polarizer, the magneto-optical component and the second polarizer. Changes in incident light flux intensity can lead to rapid changes in the intensity of light flux transmitted through the magneto-optical light modulator.

SUMMARY OF THE INVENTION

Embodiments of the invention provide for a magneto-optical light modulator for modulating light based on a physical property provided as an input to the modulator. The modulator comprises a substrate with a region of material e.g. deposited on the substrate. The region of material comprises a film of $Eu_{(1-x)}Sr_{(x)}MO_3$. Here, $0 \leq x < 1$. The modulator further comprises an optical waveguide adapted for directing light through the region of material and a first control unit, the first control unit being adapted to     maintain the region of material at a constant predefined temperature in case the physical property is an input magnetic field subject to the region of material or     maintain the region of material subjected to a constant predefined magnetic field in case the physical property is an input temperature of the region of material, the light modulator being adapted to perform the modulation of the light using the birefringence of the region of material, the birefringence depending on the physical property.

In accordance with an embodiment of the invention, M is anyone of the following metals: Ti, Hf, Zr, Th.

In accordance with an embodiment of the invention, x is smaller than 0.5, preferred smaller than 0.3.

Embodiments may have the advantage that a light modulator can be provided that is highly efficient and sensitive.

The light is directed in a predefined direction through the region of material and the underlying substrate. It has to be noted that throughout the description the formulation "direction of light through the region of material" always encompasses the direction of the light through both, the $Eu_{(1-x)}Sr_{(x)}MO_3$ and the substrate since the $Eu_{(1-x)}Sr_{(x)}MO_3$ is always located on top of the substrate.

The birefringence of the region of material determines how the light is transmitted through the material. For example, the region of material is located in between two crossed polarizers and the light is directed through the first polarizer, from the first polarizer through the region of material and from the region of material through the second polarizer. Depending on the current state of birefringence of the region of material, the region of material changes the polarization of the polarized light incident to the region of material. As a result, the light that is directed through the second polarizer is modulated in intensity.

Generally, the light modulator may be used as a wave plate in optical equipment for modifying the polarization state of light passing through it. Further, it may be used as a light modulator in nonlinear optical applications.

According to embodiments, the substrate is a $SrTiO_3$ (STO) substrate. However, any other substrate may also be used as long as it is optically transparent in the range of wavelength of the light directed through the region of material. Preferably, the lattice constant of the substrate and the deposited ETO are highly similar such that the strain in between the ETO and the substrate is minimized.

The magneto-optical activity of high quality transparent thin films of insulating $Eu_{(1-x)}Sr_{(x)}MO_3$ deposited on a thin (e.g. STO) substrate with both being non-magnetic materials may therefore be used as a versatile tool for light modulation. The operating temperature is close to room temperature and may admit multiple device engineering. By using small magnetic fields birefringence of the devices can be switched off and on. Similarly, rotation of the sample in the field can modify its birefringence Δn.

For example $EuTiO_3$ (ETO) has the cubic perovskite structure at room temperature and undergoes a structural phase transition to tetragonal at $T_S = 282K$. Below $T_N = 5.7$ K the Eu $4f^7$ spins order G-type antiferromagnetic, and large magneto-electric coupling takes place as evidenced by the magnetic field dependence of the dielectric constant.

In accordance with an embodiment of the invention, the light modulator further comprises a light source for generating the light to be directed through the region of material and a light detector adapted for determining the modulation of the light by determining the optical transparency of the region of material from the light directed through the region of material. Depending on the strength and direction of the input magnetic field, the optical transparency of the region of material can change. Analysis of this change of transparency may then be used to determine the field strength of the input magnetic field. For that purpose the temperature of the region of material has to be maintained at the constant predefined temperature. Vice versa it may be possible to analyze the change of transparency to determine the actual temperature of the active material in case the region of material is subject to a constant magnetic field. Thus, a detector can be provided which can sense magnetic fields and can act as a temperature sensor.

It is understandable for the skilled person that the transparency of the region of material can be determined in many different ways. Usage of polarized light and waveplates is just one example how the change in birefringence of the region of material depending on the input magnetic field or the temperature can be optically detected.

In accordance with an embodiment of the invention, the modulator further comprises an evaluation unit adapted to determine from the determined transparency and the constant predefined temperature the field strength of the input magnetic field or to determine from the determined transparency and the constant predefined magnetic field the input temperature. For example, the field strength of the input magnetic field and the input temperature are either determined as an absolute value or as a relative value. The relative value is determined relative to a reference value obtained in a previous determination of the optical transparency. Thus, in case the modulator is correctly calibrated, it may be possible to correctly assign a detected transparency of the region of material to a certain absolute temperature or magnetic field strength. Since the birefringence of the material strongly depends on the direction of the input magnetic field, either the direction of the input magnetic field needs to be fixed and predefined or a further sensor may be used that is able to detect the direction of the input magnetic field relative to the crystallographic orientation of the region of material. Knowledge of the direction and transparency may then be used to determine the correct absolute value of the magnetic field strength.

Especially in case the device is either not calibrated, the input temperature may be determined as a relative value relative to e.g. a reference value (reference temperature value or reference transparency value) obtained from a previous determination of the optical transparency. For example, a first measurement may be performed in which a certain transparency is determined. This transparency may be assigned to a reference value of an input temperature. In a subsequent second measurement the transparency may be determined again. In case the input temperature has changed, the transparency will also have changed to a certain degree. The ratio between the transparency determined by the second measurement and the transparency determined by the first measurement indicate the relative change in temperature. This is possible since especially for a constant magnetic field above 0.1 T and the constant magnetic field being oriented along the [1$\bar{1}$0] direction of the $Eu_{(1-x)}Sr_{(x)}MO_3$, the birefringence of the region of material shows a more or less linear dependency on the input temperature in the range of 200K-280K.

An example of application of the modulator could also be the measurement of the angular velocity of a rotating shaft of an engine. By for example mounting a magnet onto the shaft, the rotation of the shaft will cause a rotation of the magnetic field relative to the modulator. The rotating (moving or changing) magnetic field of the magnet will induce a continuous modulation of the birefringence of the region of material. This may then be detected using the light directed through the region of material. The frequency of change of the transparency of the region of material is indicative of the angular velocity of the rotating shaft.

In accordance with an embodiment of the invention, the modulator further comprises a magnet for generating the input magnetic field and a second control unit coupled to a control input, the second control unit being adapted for controlling the generating of the input magnetic field with a desired field strength and/or field direction based on an input signal receivable via the control input. This may allow for the design of an optical switch that can control the transmission of light through the region of material by tuning the magnetic field strength and/or field direction based on the input signal. Amplitude, phase or polarization modulation of e.g. laser light might be possible using the modulator at very high frequencies.

In accordance with an embodiment of the invention, the second control unit is further adapted to control the magnetic field direction of the input field using a relative rotation of the region of material and the magnet. This is possible due to the dependency of the birefringence of the region of material on the direction of the input magnetic field relative to the crystallographic orientation of the $Eu_{(1-x)}Sr_{(x)}MO_3$.

In accordance with an embodiment of the invention, the modulator further comprises a one or more of the substrates carrying a plurality of the regions of the material, the regions being spatially separated from each other, the optical waveguide being adapted for directing the light through the separated regions of the material, a magnet for generating the input magnetic field with a constant predefined field strength and/or field direction relative to the modulator.

Advantageously, all the regions of material experience the same temperature such that for all regions of material the general conditions regarding temperature and magnetic field are identical. The crystallographic orientations of the $Eu_{(1-x)}Sr_{(x)}MO_3$ of the regions may either be identical for all the regions or two different crystallographic orientations of the $Eu_{(1-x)}Sr_{(x)}MO_3$ of the regions may be used. In all cases, the crystallographic orientation is relative to the modulator. In case a single substrate is used that carries all the individual $Eu_{(1-x)}Sr_{(x)}MO_3$ regions, this means that the crystallographic orientation is relative to the substrate.

This kind of modulator may have the benefit that for example all the before described embodiments regarding usage of the modulator as a switch may be further improved regarding the switching or modulating quality. Instead of using a single region of material that is switching or modulating an incident light beam, the light beam may be split into multiple light beams that are directed using the optical waveguide through all the separated regions of material. The light directed through the regions is then bundled again into a single output light beam. Even in case the chemical quality, operational temperature or the input magnetic field of individual ones of the regions may not be as perfect as desired, "errors" resulting from such a lack of quality of operation of such individual regions may be averaged and therefore may be negligible.

A further benefit of this kind of modulator may be that the modulator can act as a binary memory for storing binary data. In that case, the binary data values may be encoded using two different crystallographic orientations of the $Eu_{(1-x)}Sr_{(x)}MO_3$ in the regions. By determining the birefringence e.g. via the transparency of the regions of material under the same determination conditions for all the regions of material, the determined birefringence will reflect the binary encoding. Dark (non-transparent or less transparent) regions may for example correspond to a value 0 while bright (transparent or more transparent) regions may correspond to a value 1.

In accordance with an embodiment of the invention, the modulator further comprises a light source for generating the light to be directed through the regions of material, a light detector adapted for determining the modulation of the light by determining the optical transparency of each region of material from the light directed through said region of material, an evaluation unit adapted to determine from the determined transparencies one or more binary data values encoded using two different crystallographic orientations of the $Eu_{(1-x)}Sr_{(x)}MO_3$ in the regions, the two crystallographic orientations being relative to the modulator.

This embodiment may provide for a fully integrated device that can be coupled to any data processing system via an interface and serve as a permanent memory (ROM). The benefit of such kind of memory may be the durability of the device. Many optical memories like DVDs or CDs have a limited durability due to a natural degradation of the used polymers. Magnetic memories like hard disk drives or magnetic tapes have a limited durability due to the risk of reorientation of the magnetic domains used for storage data. However, in case of the discussed modulator the risk of an autonomous reorientation of the crystallographic orientations of the regions of material is significantly lower or even zero. Further, accidently exposure of the modulator to external magnetic fields does not harm the crystallographic orientations of the regions of material and for a large range of temperatures the crystallographic stability of the regions is guaranteed. This may favor usage of the modulator for highly stable and safe data storage.

It has to be noted that the desired crystallographic orientations of the $Eu_{(1-x)}Sr_{(x)}MO_3$ in the regions can be achieved in multiple ways. Examples are mechanical orientations of the $EuTiO_3$ using mechanical tools like AFM tips on existing substrate surfaces. Further, it may be possible to pre-structure the substrate in individual islands in such a manner that first the crystallographic orientation of individual substrate islands is predefined. Subsequent deposition of $Eu_{(1-x)}Sr_{(x)}MO_3$ on the islands may then lead to a self-alignment regarding the crystallographic orientation of the $Eu_{(1-x)}Sr_{(x)}MO_3$ crystals dependent on the underlying crystallographic orientation of the individual substrate island. Thus, the pre-structuring of the substrate is performed in order to obtain the desired two crystallographic orientations of the $Eu_{(1-x)}Sr_{(x)}MO_3$. The pre-structuring of the substrate may be performed using lithographic techniques.

In accordance with an embodiment of the invention, the region of material together with the substrate has an optical transparency larger than 85% at an optical wavelength of 400 nm to 700 nm. Preferably, the optical transparency is larger than 92%.

In accordance with an embodiment of the invention, the $Eu_{(1-x)}Sr_{(x)}MO_3$ is single crystalline. Further,
the input magnetic field and the constant magnetic field are oriented along the [1$\bar{1}$0] direction of the $Eu_{(1-x)}Sr_{(x)}MO_3$ and/or
the constant magnetic field is larger than 0.05 T and/or
the constant temperature is in between 100K and 280K.
the light generated by the light source has an optical wavelength in between 400 nm and 700 nm.
Preferably, the constant magnetic field is larger than 0.1 T.
The following further combinations of input magnetic field orientations and constant temperature ranges may be beneficial:
constant magnetic field oriented along the [1$\bar{1}$0] direction of the $Eu_{(1-x)}Sr_{(x)}MO_3$ and the constant temperature in between 100K and 280K, more preferably in between 100K and 250K,
constant magnetic field oriented along the [110] direction of the $Eu_{(1-x)}Sr_{(x)}MO_3$ and the constant temperature in between 100K and 200K, more preferably in between 100K and 180K,
constant magnetic field oriented along the [010] direction of the $Eu_{(1-x)}Sr_{(x)}MO_3$ and the constant temperature in between 100K and 200K, more preferably in between 100K and 180K.

In another aspect, the invention relates to a magnetic field sensor, a temperature sensor, a signal processor and a memory device, each comprising the above described modulator.

In another aspect, the invention relates to a memory device for storing one or more binary data values, the memory device comprising a one or more substrates (e.g. $SrTiO_3$ substrates) with a plurality of regions of material, each region of material comprising a film of $Eu_{(1-x)}Sr_{(x)}MO_3$, the regions being spatially separated from each other, the $Eu_{(1-x)}Sr_{(x)}MO_3$ being single crystalline, the binary data values being encoded in the regions using two different crystallographic orientations of the $Eu_{(1-x)}Sr_{(x)}MO_3$ in the regions, the two crystallographic orientations being relative to the device. In case of a single substrate the two crystallographic orientations are relative to the substrate.

The memory device may be provided either in a manner like for example a flash drive or a solid state drive in which no moving mechanical components are present. Alternatively the memory device may be provided as a disk that can be spun to optically read out the encoded information. It is also possible to provide the memory device in such a manner that a movable read head can read information in a desired manner from the individual regions of material.

In another aspect of the invention, a reader is provided for reading the memory device. The reader comprises a magnet generating a magnetic field at a readout zone of the reader. The magnetic field has a constant magnetic field strength and a constant field direction with respect to the device, wherein the reader further comprises a processor and a memory, the memory comprising instructions, wherein execution of the instructions by the processor causes the reader to:
determine in the readout zone the optical transparencies of the regions along a predefined constant direction relative to the device,
determine from the determined transparencies the binary data values encoded in the regions.

In case the memory device is a spinning disk, the readout zone is given by a certain spatial area of the reader through which the regions of material are moved by means of the rotation. Generally, in the readout zone, the magnetic field and the local temperature are constant. Further, it is possible that more than one readout zone is used for reading the binary data values. Thus, multiple readout zones may be used simultaneously.

In case the memory is provided as a static non movable arrangement of the regions of material, the reader may either comprise one or more read heads that are movable to desired individual regions of the material. Thus, the readout zone moves together with the read head(s). Further, it is possible that the readout zone covers simultaneously all the regions of material. Further, each region of material is associated with a fixed read head (detector) such that no movable parts are required any more.

In another aspect, the invention relates to a method for reading a memory device storing one or more binary data values, the memory device comprising a one or more substrates (e.g. $SrTiO_3$ substrates) with a plurality of regions of material, each region of material comprising a film of $Eu_{(1-x)}Sr_{(x)}MO_3$, the regions being spatially separated from each other, the $Eu_{(1-x)}Sr_{(x)}MO_3$ being single crystalline, the binary data values being encoded in the regions using two different crystallographic orientations of the $Eu_{(1-x)}Sr_{(x)}MO_3$ in the regions, the two crystallographic orientations being relative to the device, the reader comprising a magnet generating a magnetic field at a readout zone of the reader, the magnetic field having a constant magnetic field strength and a constant field direction with respect to the device, the method comprising:

determining in the readout zone the optical transparencies of the regions along a predefined constant direction relative to the device, determining from the determined transparencies the binary data values encoded in the regions.

In another aspect, the invention relates to a computer program product comprising computer executable instructions to perform the method as described above.

It is understood that one or more of the aforementioned embodiments of the invention may be combined as long as the combined embodiments are not mutually exclusive.

BRIEF DESCRIPTION OF THE DRAWINGS

In the following preferred embodiments of the invention are described in greater detail by way of example only, making reference to the drawings in which.

In the following, similar elements are depicted by the same reference numerals.

Figure 1:
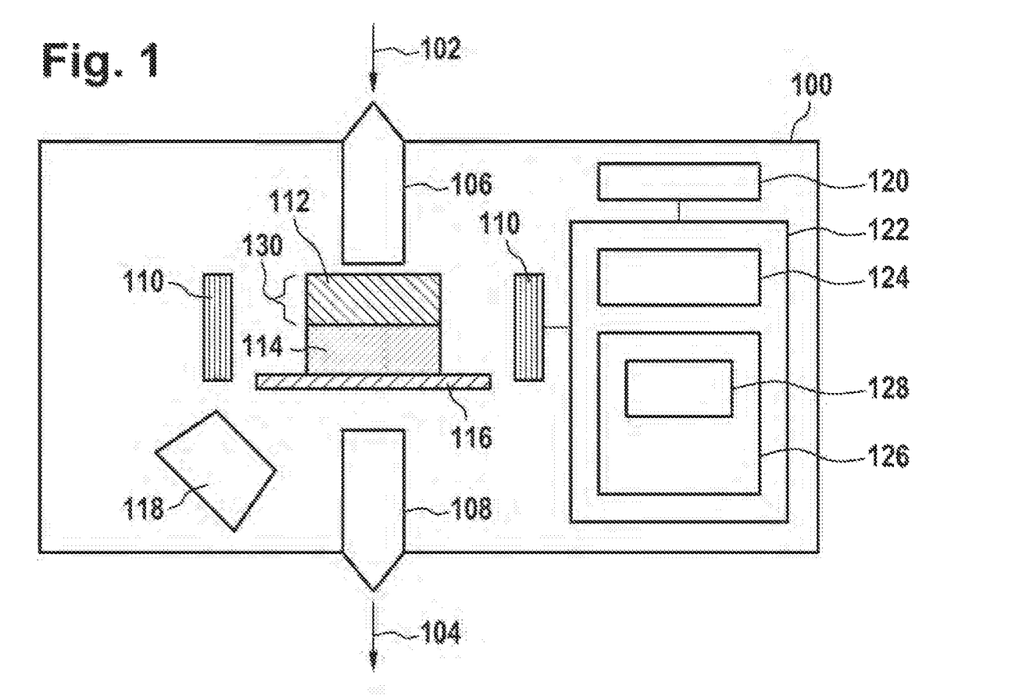
FIG. 1 is a block diagram of a magneto-optical light modulator serving as a signal processor.

FIG. 1 illustrates a block diagram of a magneto-optical light modulator 100 serving as a signal processor. The modulator 100 comprises a first optical waveguide 106 and a second optical waveguide 108. The two waveguides are adapted for directing light in a predefined direction through a region of material 130 and an underlying substrate 114. The light beam 102 that is incident to the optical waveguide 106 is transmitted through the region of material 130 and the underlying substrate 114, captured by the optical waveguide 108 and coupled out from the waveguide 108 as transmitted light beam 104.

In the following for the case of simplicity it is assumed without restriction to generality that a film of $EuTiO_3$ is used, i.e. that in $Eu_{(1-x)}Sr_{(x)}MO_3$ x has the value 0 and M is given by Ti. However, the skilled person will understand that x may have other values 0≤x<1 and that M may be any metal selected from Ti, Hf, Zr, Th.

The region of material 130 comprises a film of $EuTiO_3$ (ETO) deposited on a SrTiO3 (STO) substrate. The ETO is designated by reference numeral 112 and the STO is designated by reference numeral 114. A carrier 116 is supporting the region of material 130 and the substrate in the modulator 100. It has to be noted here that throughout the description the substrate 114 itself can form the carrier that carries the ETO.

The modulator 100 further comprises an electric magnet 110. The direction of the magnetic field relative to the crystallographic orientation of the ETO 112 is fixed. However, by means of the controller 122 the intensity of the magnetic field generated by the magnet 110 can be modulated. The controller 122 comprises a processor 124 and a memory 126. The memory 126 comprises instructions 128 that can be executed by processor 124 in order to control the controller 122. Execution of the instructions 128 causes the controller 122 for example to translate control signals received via an interface 120 to control signals that accordingly operate the magnet 110.

Further illustrated in FIG. 1 is a temperature controller 118. The temperature controller 118 comprised in the modulator 100 is adapted to maintain the region of material 130 at a predefined temperature.

At a certain temperature and by applying the magnetic field, the birefringence of the region of interest 130 can be tuned. For example, the optical waveguides 106 and 106 comprise crossed polarizers. Depending on the current state of birefringence, the polarized light entering in FIG. 1 from top into the region of interest is modulated. As a result, the light intensity of the light beam 104 is modulated.

Therefore, depending on the control signals received via the interface 120 the intensity of the light beam 104 can be modulated and controlled. Without using a polarizer with the optical waveguide 108, the polarization of the light beam 104 can be modulated.

Figure 2:
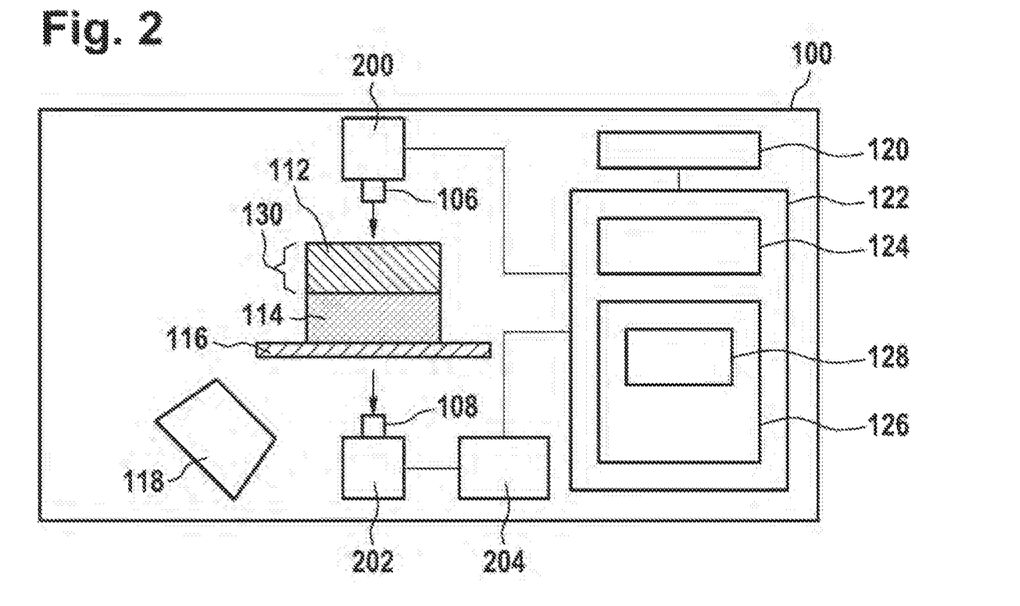
FIG. 2 is a block diagram of a magneto-optical light modulator serving as a magnetic field detector.

FIG. 2 is a block diagram of a magneto-optical light modulator 100 serving as a magnetic field detector. Instead of using a predefined static magnetic field, the region of interest 430 is only maintained at a predefined temperature using the temperature controller 118. A light source 200 is providing the light beam via the optical waveguide 106 through the region of interest 130 and the substrate 114. A light detector 202 detects via the optical waveguide 108 the light that is transmitted through the region of interest 130 and the substrate.

Depending on the magnetic field that is experienced at the region of interest 130, the intensity or the polarization of the light beam detected by the detector 202 is modulated. Again, as described above with respect to FIG. 1, the optical waveguides may comprise according waveplates or polarizers that permit the detection the phase change due a change in the birefringence properties of the material in the region 130.

Again, the modulator 100 comprises the control unit 122 comprising the processor 124 and a memory 126, wherein the memory 126 comprises instructions 128. The instructions 128 permit to the control an evaluation unit 204 to attribute the detected transparency of the region of material 130 via the measured light intensity by the detector 202 to a certain magnetic field strength experienced by the region of material 130. Further, the instructions 128 permit to provide the determined magnetic field strength via the interface 122 to a recipient, for example an external data processing system.

Figure 3:
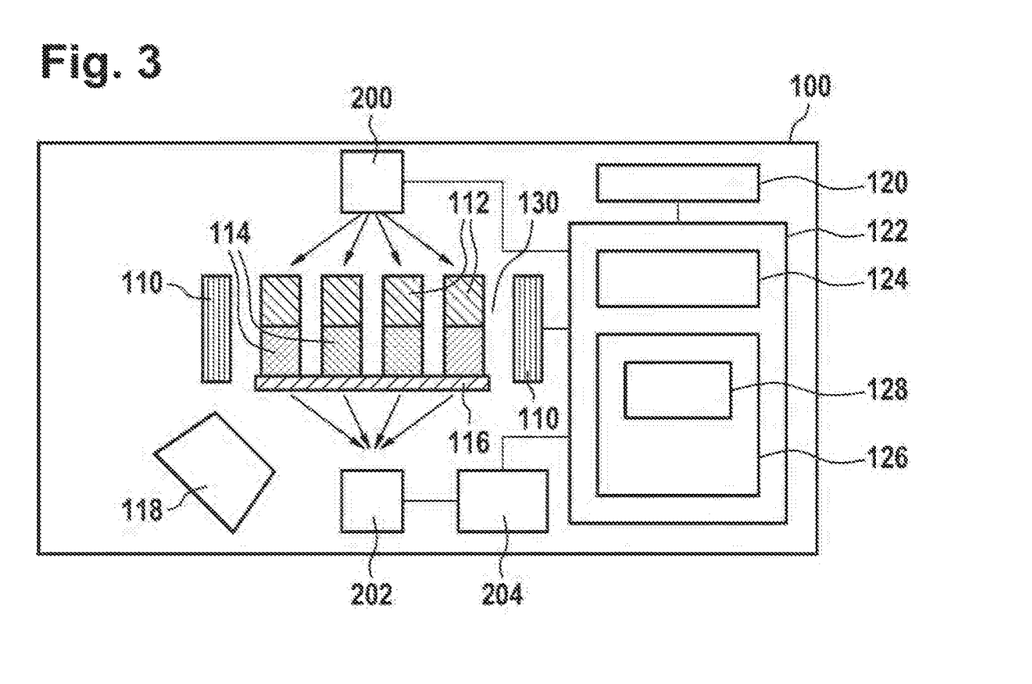
FIG. 3 is a block diagram of modulator serving as a memory device.

FIG. 3 illustrates a block diagram of a modulator 100 that is serving as a memory device. For that purpose the modulator 100 comprises a plurality of the regions of material 130. The regions of material 130 are all supported by the carrier 116 and are encoding binary data values. The binary data values are encoded using two different crystallographic orientations of the ETO 112 relative to the carrier 116. By applying a constant magnetic field via the magnet 110 and maintaining all the regions of material at the constant same temperature using the temperature controller 118, the ETO will have two well-defined birefringence states which can be distinguished from each other using polarized light generated by the light source 200 and detected via a further polarizer using the detector 202.

The detector 202 is again coupled to an evaluation unit 204 which is adapted to assign the detected light intensity for each region of material 130 to a certain binary value zero or one. In a practical example, the control unit 122 comprising the processor 124 and the memory 126 with its instructions 128 is able to control the light source 200 in order to emanate the respective polarized light beam to a specific one of the regions of material 130. Execution of the instructions 128 may cause for example a movement of the light source 200 in such a manner that the emanated light beam is transmitted through the desired region of material and then captured by the detector 202. Thus, each "memory cell" 130 can be addressed individually and read out individually.

Figure 4:
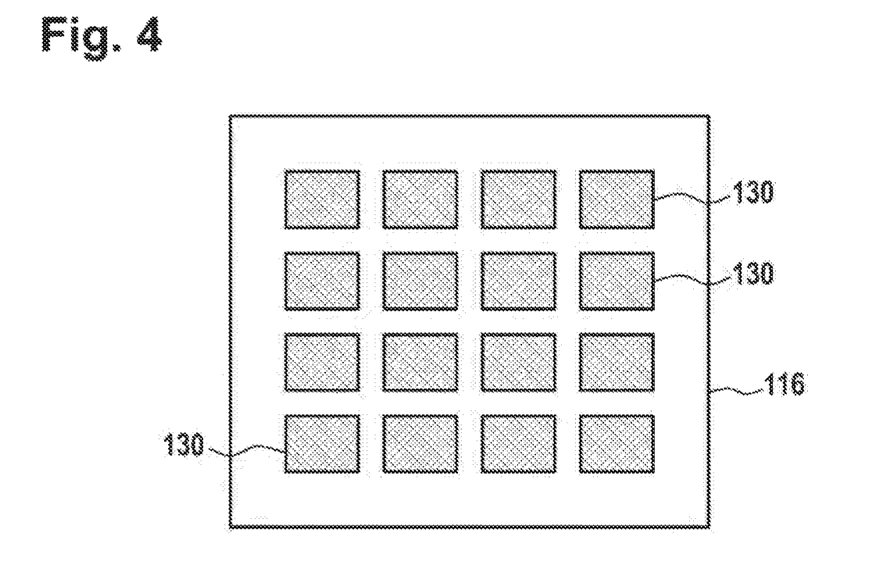
FIG. 4 is a schematic of a memory device comprising a multitude of memory cells.

FIG. 4 is a schematic top view onto the carrier 116 carrying a multitude of regions of material 130. Thus, by means of the two dimensional movement of the light source 200 of FIG. 3 and if necessary also of the light detector 202 of FIG. 3, binary information encoded using the birefringence properties of the regions of material can be read out.

The read information can then be provided via the interface 120 to an external data processing system.

In the following, details will be described regarding an exemplary preparation of the region of material 130 on the substrate 114. Films of ETO deposited on a e.g. a thin STO substrate can be provided which are highly transparent, single crystalline, cubic at room temperature, and strain/stress free. These films allow to observe their birefringence properties in the tetragonal phase and enable to detect a further structural phase transition at $T^* \approx 190K$ from tetragonal to monoclinic.

Samples of ETO may be synthesized by repeatedly heating mixtures of $Ti_2O_3$ and $Eu_2O_3$ at 1300° C. with intimate grinding in between, which ensures optimal target properties. The films may be grown on STO (001) single crystal substrates. For the PLD ablation process a KrF excimer laser with a wave length of 248 nm may be used. The energy density on the target may be ~1.6 J/cm$^2$ and the frequency of the pulsed laser beam may be 10 Hz. A deposition rate of ~0.257 Å/pulse may be used, e.g. calibrated by measuring the film thickness with a profilometer. Using a resistive heater the substrate temperature may be kept constant at 600° C. during the film growth according to the radiation pyrometer reading. While depositing the film an oxygen flow with a flow rate 4.4 sccm should be assured, with the pressure in the deposition chamber being $1 \cdot 10^{-5}$ mbar. Accordingly produced films have been characterized by scanning electron microscopy (SEM) showing a smooth and homogenous surface, atomic force microscopy (AFM) verifying a surface roughness of less than 0.25 nm, and x-ray diffraction (Cu K$\alpha_1$ radiation) confirming cubic symmetry at room temperature with no c-axis shrinkage or expansion. The resistivities of the films were larger than 10MΩ, and the band gap, as determined by spectroscopic ellipsometry, 4.53±0.07 eV.

Figure 5A:
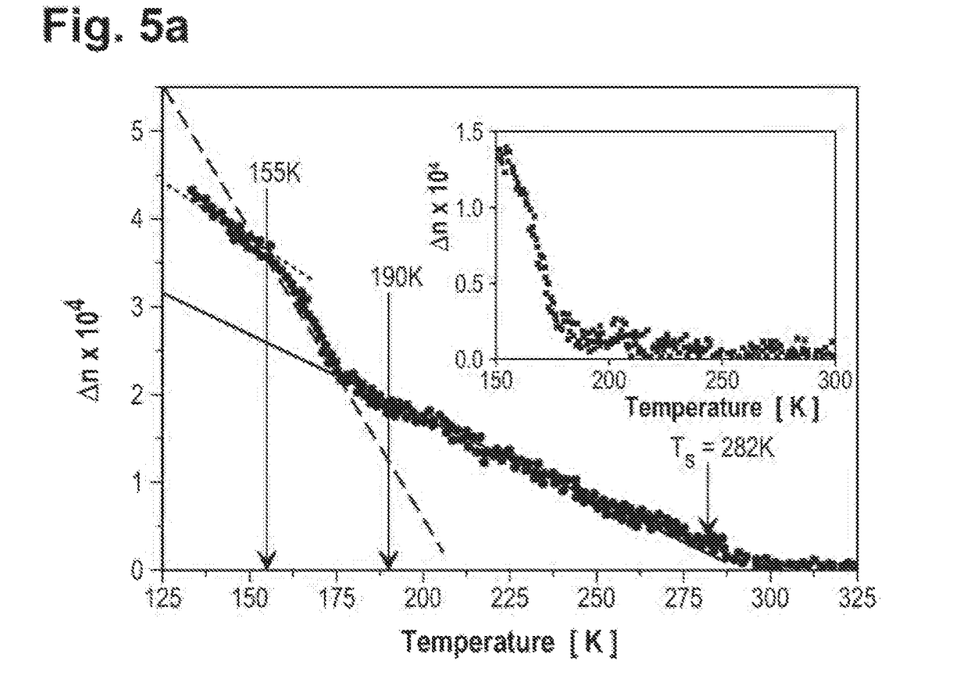
FIG. 5 depicts the measured birefringence on an ETO film and of the STO substrate.
Figure 5B:
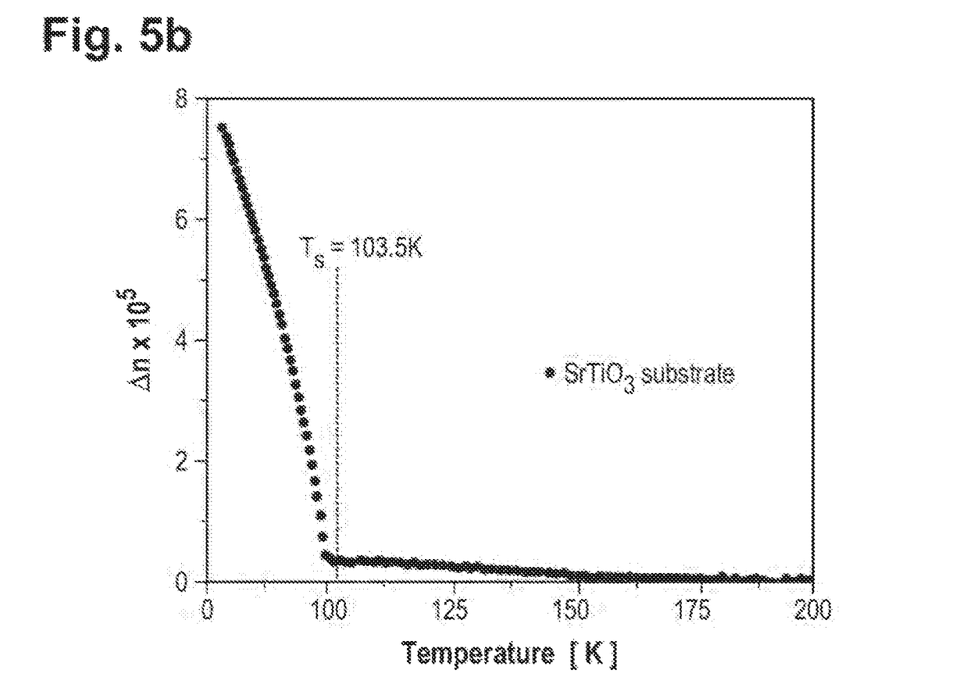

Magnetic susceptibility measurements have been carried out and confirmed the transition to AFM order at $T_N=5.1K$. The cubic-tetragonal transition at $T_S=282K$ was detected by birefringence $\Delta n$ measurements (FIG. 5a). FIG. 5a illustrates the measured birefringence $\Delta n$ of the ETO film as a function of temperature. The two transition temperatures are marked by vertical lines. The straight red line is the behavior of the birefringence as expected from Landau theory. The dashed line indicates the change in slope below 190K, and the dotted line refers to the next slope change caused by the precursor dynamics of STO. The inset shows the same, however, with the data being subtracted by the straight line. At $T_S$ $\Delta n$ adopts finite values and increases linearly with decreasing temperature. A deviation of $\Delta n$ from linearity sets in around $T^* \approx 190K$ and is exemplified in the inset to the figure where the linear part has been subtracted. Another change in slope takes place around 150K, which can be assigned to the onset of precursor dynamics of the STO substrate (FIG. 5b, showing the measured birefringence of the STO substrate).

Birefringence measurements were made on an ETO film with thickness of 1 µm oriented in [001] direction and deposited on a single crystal STO substrate. The thickness of the film and substrate together was 85 µm. In all measurements a Linkam TMSG600 temperature stage was used combined with a Metripol Birefringence Imaging System (Oxford Cryosystems). This system consists of a polarizing microscope and a computer controlling number of rotations of the polarizer (usually 10 rotations), an analyzer and a CCD camera measuring light intensity I at each position of the polarizer. This intensity is given by the following relation:

$$I = \tfrac{1}{2} I_0 [1 + \sin(2\Phi - 2\alpha)\sin \delta]$$

where $I_o$ is the intensity of light that passes through the sample (transmittance), $\Phi$ is the angle of an axis of the optical indicatrix in relation to the pre-determined horizontal axis, and $\delta$ is the phase difference between the polarized light components, and reads:

$$\delta = 2\pi\lambda^{-1}(n_1 - n_2)d,$$

where $\lambda$ is the wavelength of the light and d is the thickness of sample (in our case of the thin film). The birefringence is defined as $\Delta n = (n_1 - n_2)$ and was measured as seen in projection down the microscope axis. The interesting feature of the Metripol system is to rectify results from a background stemming from uncorrected optical signals, e.g. originating from glass windows used in TMSG600 stage. Because of this background the final signal is a kind of effective retardation described by:

$$\delta^* = \{[\delta_m \sin(2\varphi_m) - \delta_b \sin(2\varphi_b)]^2 + [\delta_m \cos(2\varphi_m) - \delta_b \cos(2\varphi_b)]^2\}^{1/2}$$

where $\delta_m = \sin^{-1}(|\sin \delta_m|)$ and $\varphi_m$ are the phase shift and orientation angle of the sample (here the ETO/STO sample), and $\delta_b = \sin^{-1}(|\sin \delta_b|)$ and $\varphi_b$ are the phase shift and orientation angle of the background outside the sample. In this way the birefringence can be detected with a very high sensitivity of the order of $10^{-6}$.

The main axis of the indicatrix could be oriented 0° or 90° to the [001] direction of the tetragonal unit cell. As a consequence, the measuring light beam passing through the ETO/STO sample was not parallel to the optic axis ([001] direction for the tetragonal symmetry), and the light was split into the ordinary and extraordinary ray. Since an important benefit of this system, in comparison to the conventional crossed polarizer method, is that the orientation of the indicatrix (i.e. the specimen) does not matter and that the absolute value of $\Delta n$ is determined, these two possible orientations of the optic indicatrix are not an obstacle to obtain the temperature dependence of the birefringence. Experimentally, the wavelength of 570 nm was used. By measuring several images with varying angle $\alpha$, it is possible to determine for each pixel position the quantities $I_0$, $\sin \delta$ and $\varphi$ separately, and then to plot images in false color representing these three values.

The temperature was controlled to within ±0.1K, and the measurements were made with optimal cooling and heating rates not larger than 0.7K per minute. It was confirmed that slower rates did not change the experimental results. Prior to each measurement, the sample was rejuvenated (e.g. to minimize stresses in the sample) at a temperature of 470K for half an hour.

Another benefit of this method is that it is possible to produce orientation images which are obtained by subtracting one image from another. In the case of images presented in the present patent application the subtracted image was taken at 350K, i.e. far above the transition point to the cubic phase. This image was treated as a background produced by the uncorrected optical anisotropy from the optical path or reflections from lenses.

As can be seen from FIG. 5, besides of TS=282K a second phase transition occurs around T*≈190K as indicated by a change of the slope of the temperature dependence of Δn. This is shown more clearly in the inset to FIG. 5 where the Landau type behavior (straight line of the main figure) has been subtracted from the data. In order to explore the properties of ETO around and below T* and derive the symmetry of the structure, the birefringence data were taken in a magnetic field with the field direction being rotated such that H was parallel to [100], [010], [110] and [1$\bar{1}$0], respectively.

Figure 6A:
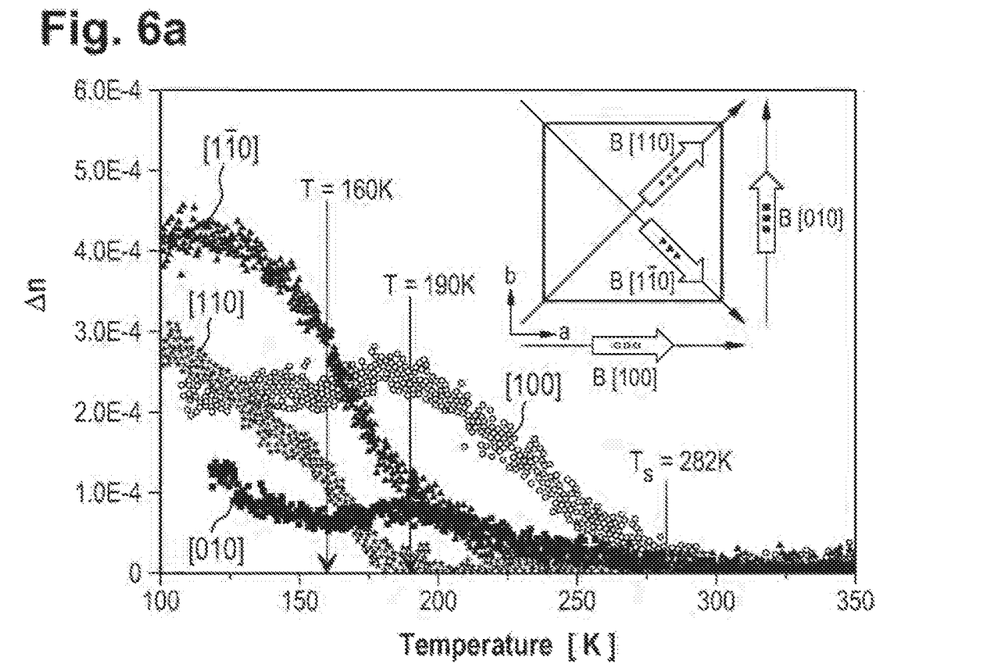
FIG. 6 depicts the measured birefringence on an ETO film as a function of temperature.

The sample's orientation was carefully checked with the tetragonal c-axis being well oriented in [001] direction of the STO substrate. Three magnetic field strengths have been used, namely H=0.02 T, 0.063 T and 0.1 T. An overview over all orientations mentioned above in the smallest field of 0.02 T is given in FIG. 6a in the temperature range between 100 and 340K. FIG. 6a depicts the birefringence of the ETO film as a function of temperature in a magnetic field of 0.02 T. The magnetic field orientation with respect to the crystallographic axis of the sample is shown in the inset to the figure. The vertical lines indicate $T_S$, T* and the onset of precursors of STO.

Figure 6B:
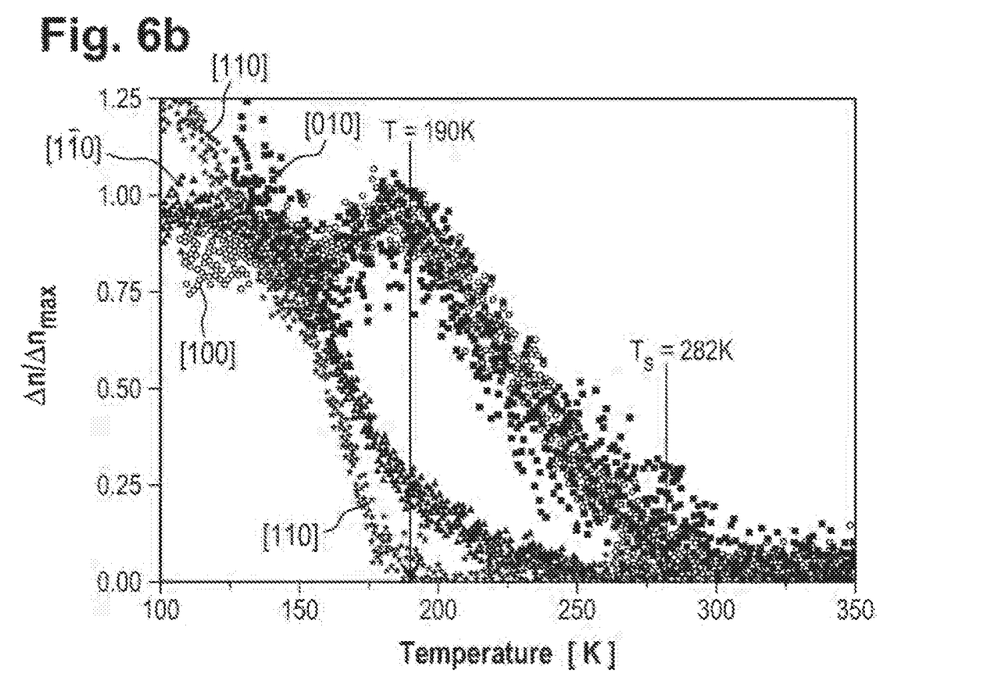
Figure 7A:
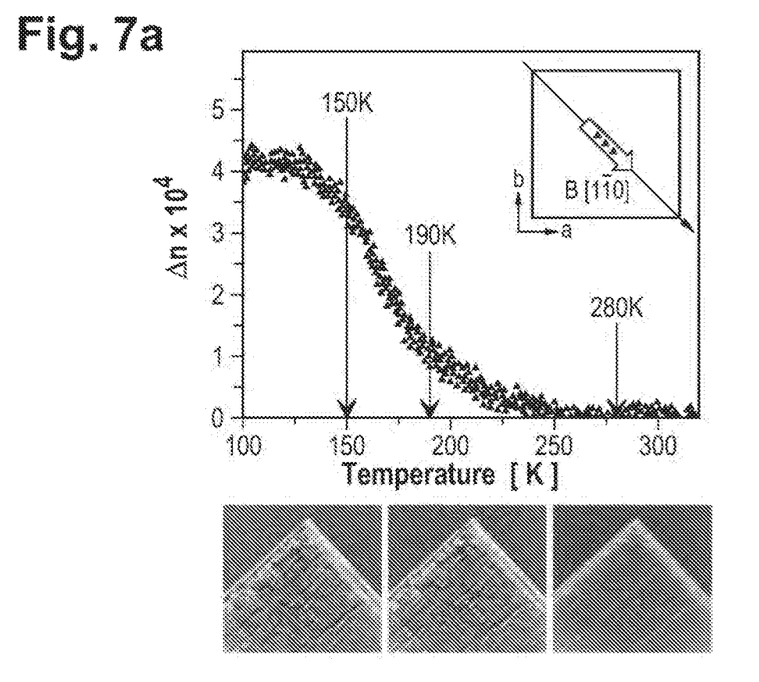
FIG. 7 depicts the measured birefringence on an ETO film as a function of temperature at H=0.02 T.
Figure 7B:
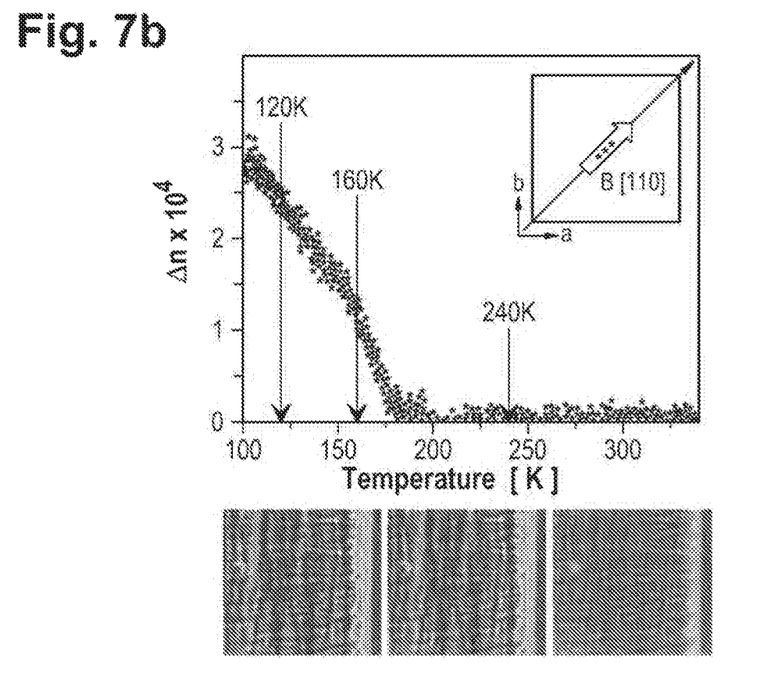
Figure 7C:
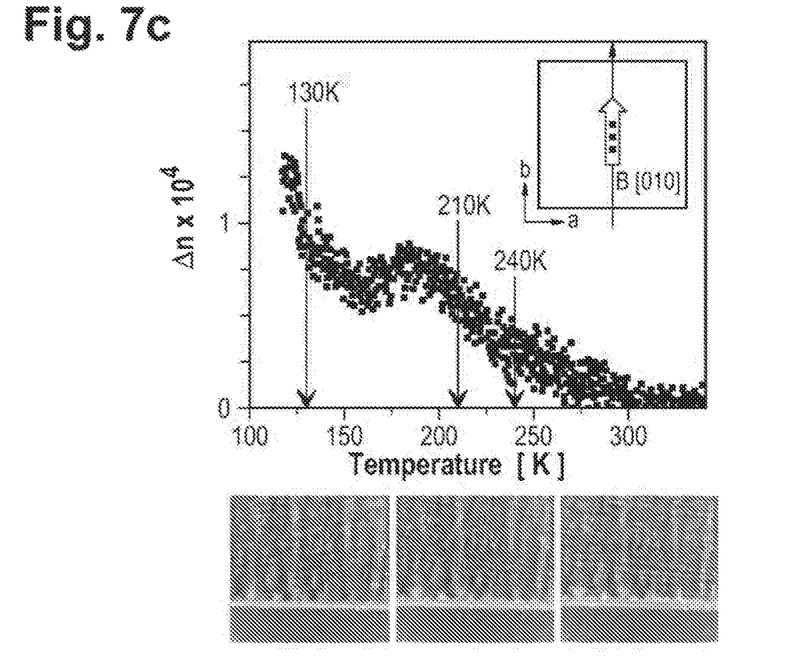
Figure 7D:
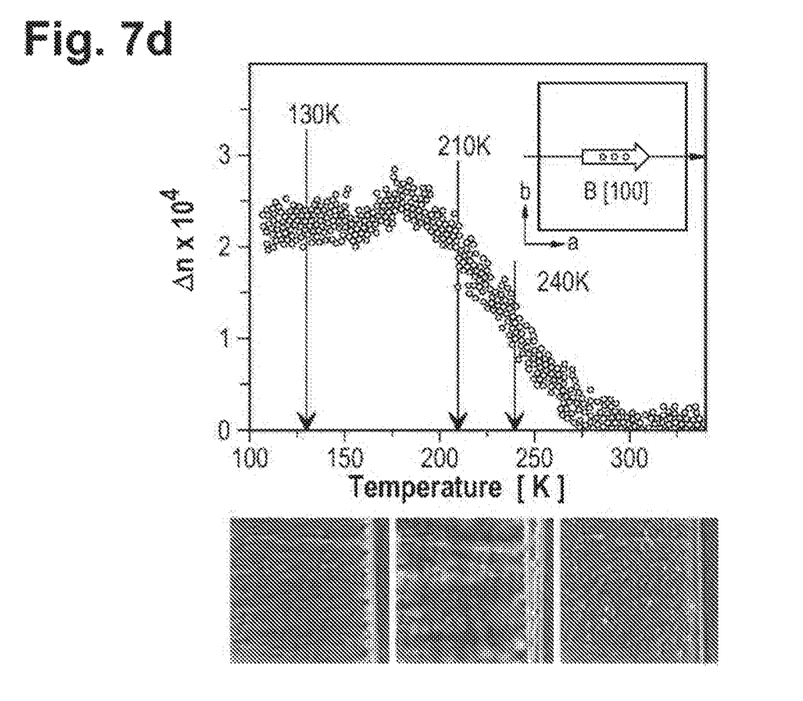

At a first glance the complete loss of birefringence with the field along the [110] direction for T<$T_S$ and its abrupt onset at T* is very striking. This is in stark contrast to the data taken in the opposite direction, namely along [1$\bar{1}$0] where Δn smoothly increases below ~240K to steeply increase around 180K. Along the [100] and [010] directions the behavior of Δn is very different since the birefringence becomes finite at $T_S$ and increases linearly, as expected from Landau theory, and exhibits a maximum around T* followed by an almost temperature independent regime for T<T*. Since tiny misalignments of the sample with respect to the external field cannot be completely ruled out, the data in FIG. 6a have been normalized to their maxima values in the displayed temperature region and are shown in FIG. 6b: here the data was normalized with respect to their maximum around 180K for the [010] and data and around 100K for [1$\bar{1}$0], and [110] data. The vertical lines mark $T_S$ and T*.

The distinct differences between all field directions are now less pronounced and especially the data taken along [100] and [010] are almost identical, at least in the range between T* and $T_S$ where the tetragonal symmetry is realized. However, [110] and [1$\bar{1}$0] differ substantially from those and between each other already well above T*. The zero birefringence in both directions below $T_S$ is well understandable since in these directions the tetragonal domain structure renders them isotropic. The differences between both appearing below 250K evidence, however, that the structure has changed with the most dramatic change setting in at T*. A visualization of these alterations is best achieved by looking at the orientation images, i.e., the angle ϕ changes Δϕ of the inclination of the optical indicatrix, as obtained for all directions and selected temperatures (FIG. 7).

FIG. 7 a) to d) depict the temperature dependence of the birefringence (upper parts to the figures) in a magnetic field of H=0.02 T oriented along (a) [1$\bar{1}$0], (b) [110], (c) [010], and (d) [100]. The vertical lines indicate the temperatures at which the orientation images of the birefringence (lower parts to the figures) have been taken. It is important to note that birefringence reveals also quite regular but different stresses at each edge of the sample.

Since the data presented in FIG. 7 are visible in an external magnetic field, for further measurements the magnetic field strength was increased from 0.02 T to 0.1 T, still being moderately small for device designs. The results are shown in FIG. 8 depicting the resulting birefringence of the ETO film in a magnetic field of H=0.1 T with the field being directed along (a) [1$\bar{1}$0], (b) [110], (c) [100], and (d) [010].

Figure 8A:
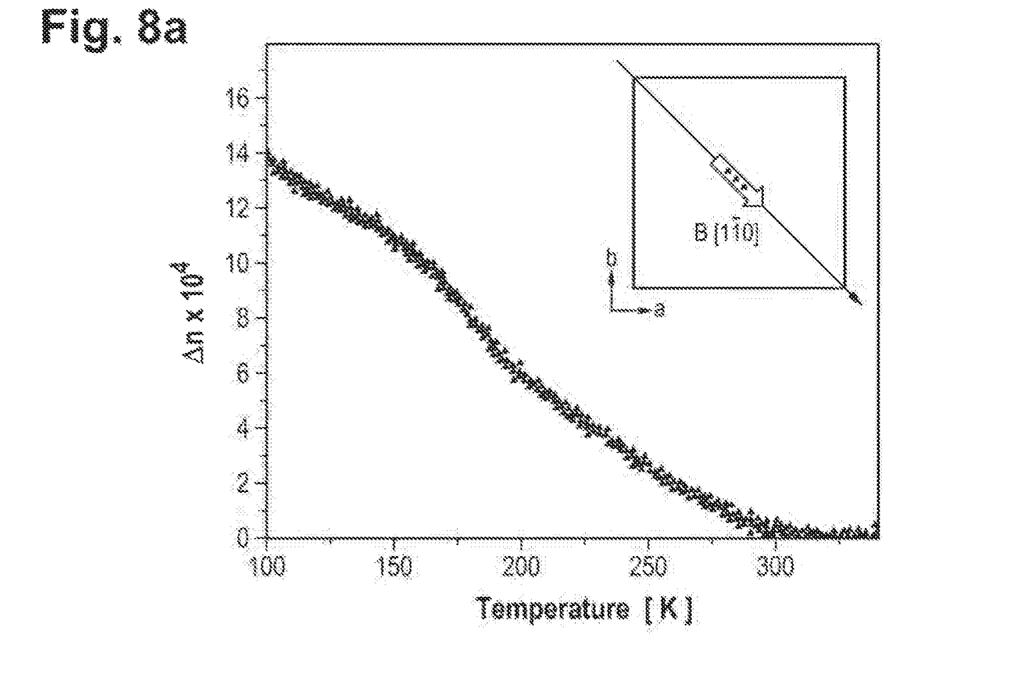
FIG. 8 depicts the measured birefringence on an ETO film as a function of temperature at H=0.1 T.
Figure 8B:
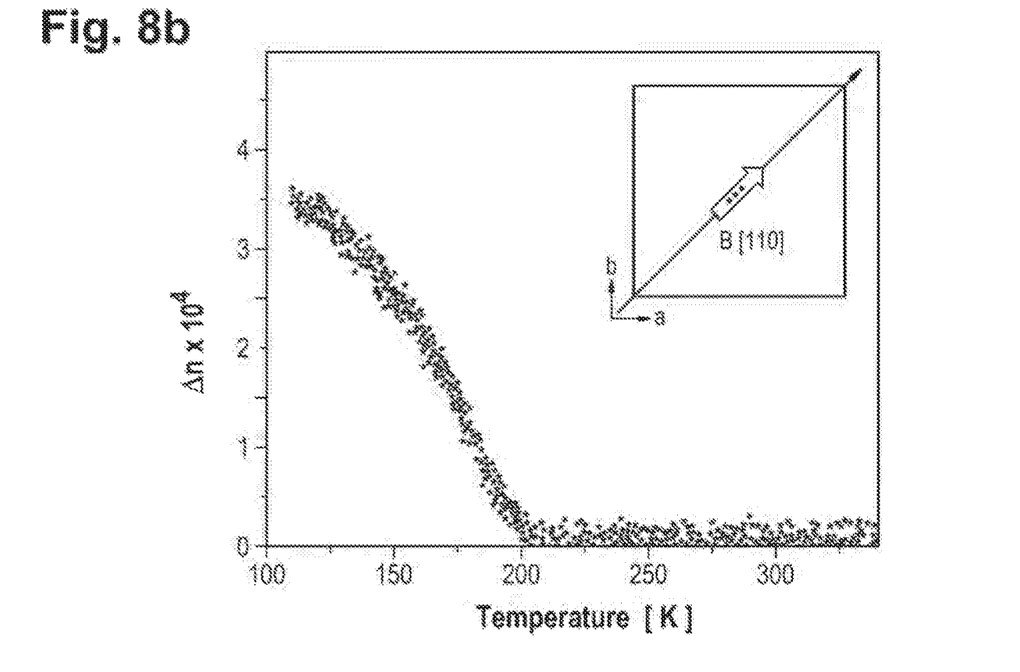
Figure 8C:
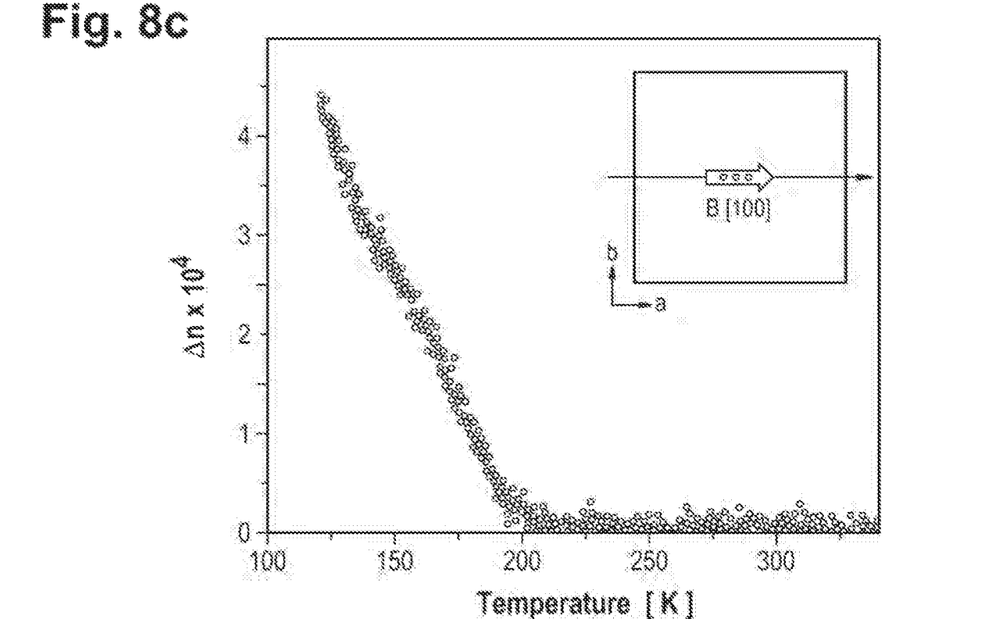
Figure 8D:
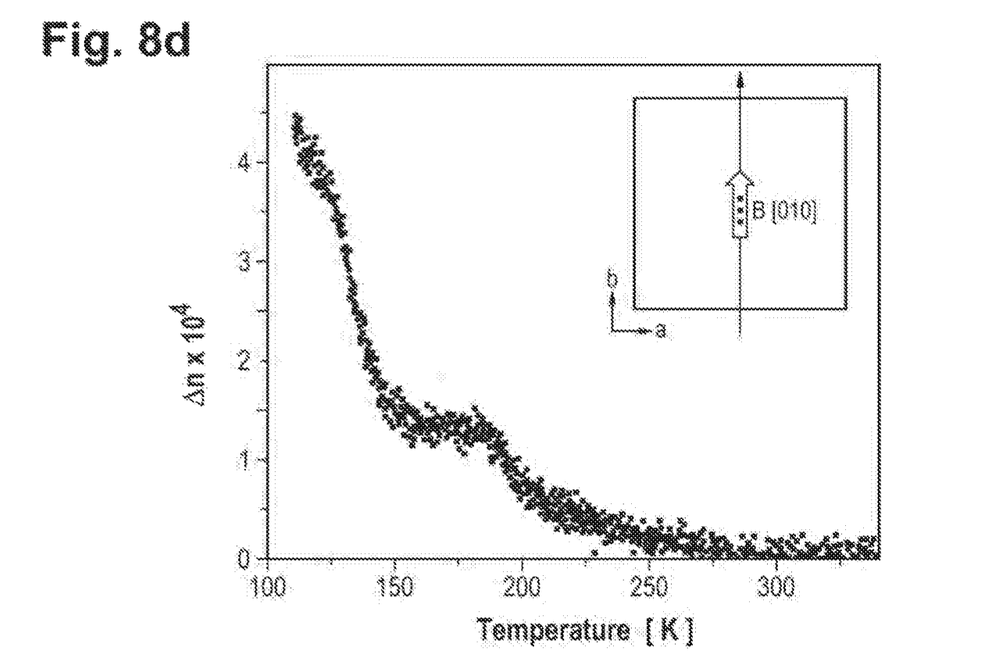

It is important to note that the scale of the birefringence between FIG. 8a) and the remaining FIGS. 8b)-c) has been changed by a factor of ~3. Now very pronounced differences appear along all directions, where only FIGS. 8a and 8d reveal distinct signatures of the phase transition from cubic to tetragonal at $T_S$=282K, quite opposite to the low field data. The transition at T* is clearly visible in FIGS. 8b and 8c signaled by a marked sudden onset of Δn. However, also along [010] this transition appears in the form of a maximum followed by a further increase in Δn below 150K while only a small anomaly distinguishes this transition along [1$\bar{1}$0]. From these results it must be concluded that a magnetic field of only 0.1 T dramatically influences Δn and the transition at T* and induces another phase transition at $T_S$=282K with the symmetry being different from tetragonal since Δn differs substantially along the directions [100] and [010] incompatible with tetragonal symmetry. On the other hand [010] and [110] are rather similar supporting this conclusion. The most striking feature in FIG. 8 is, however, the huge increase in Δn along [1$\bar{1}$0], where it is more than three times larger than without field or with the field being H=0.02 T.

Figure 9A:
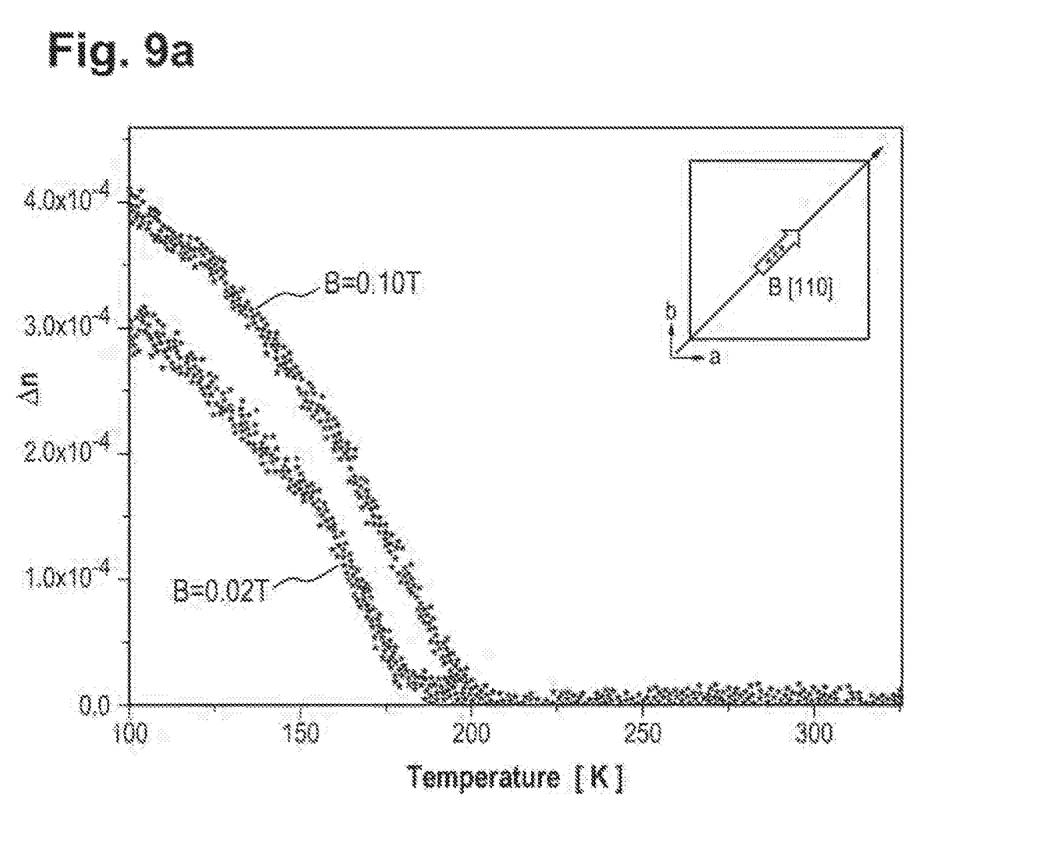
FIG. 9 depicts the measured birefringence on an ETO film as a function of temperature.
Figure 9B:
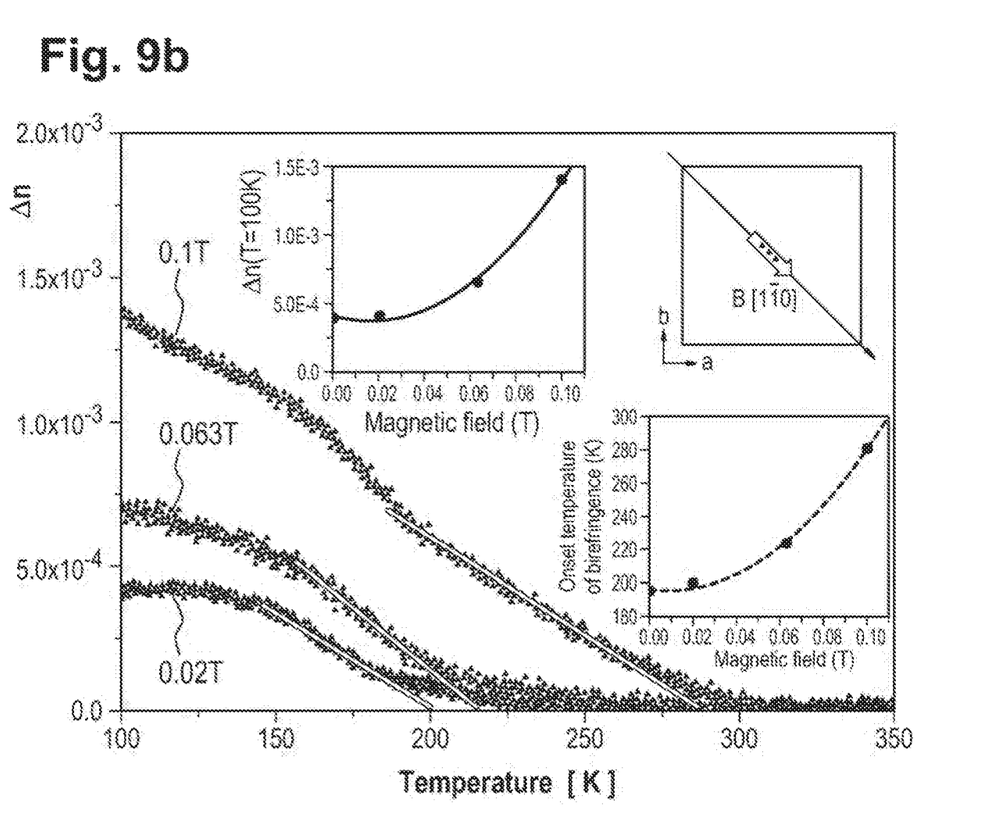
Figure 9C:
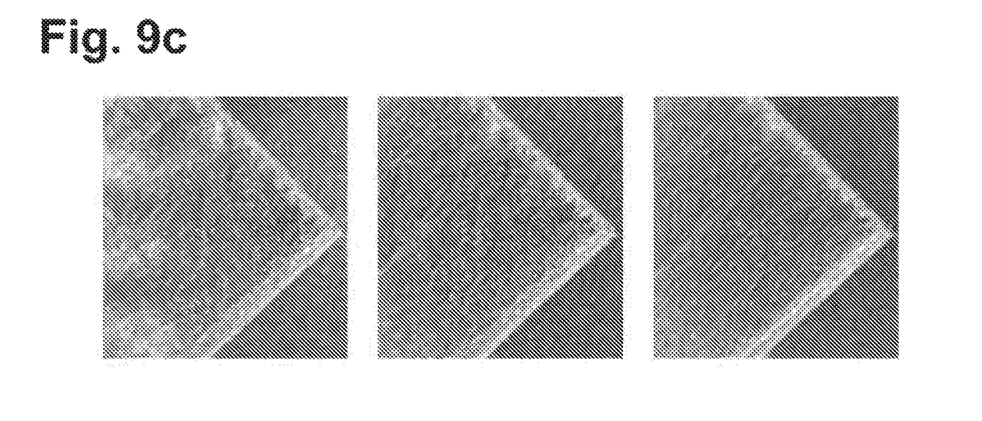

This opens avenues for device designs by tuning the transparency of the films by a magnetic field. Since the data for H along [1$\bar{1}$0] are the most striking ones and exhibit the most dramatic effects, their Δϕ images are shown in FIG. 9a-c where also the transition at T=282K is distinctly recognizable since at T=240K<$T_S$ clear signs of a finite Δn are visible. FIG. 9a depicts the birefringence of the film in a field of H=0.02 T (circles), and H=0.1 T (squares) with the field direction along [110]. FIG. 9b shows the same with the field along [1$\bar{1}$0], and field strengths H=0.02 T (circles), 0.063 T (triangles), and H=0.1 T (open squares). The straight lines refer to the extrapolated onset temperatures of Δn as shown in the inset (right) to this figure. The insets show the onset temperature of Δn versus magnetic field (right) and Δn (T=100K) versus H (left). FIG. 9c) shows Δϕ images in a magnetic field of H=0.1 T taken along [1$\bar{1}$0] for temperatures T=85, 170, 240K (from left to right).

While for $T_S$>T>T* stripe like domains appear, these change to a checkerboard pattern below T* which stays down to temperatures as low as 85K with its brightness increasing. The change from stripes to checkerboards goes hand in hand with the transition at T*. Since the two orthogonal directions [110] and [1$\bar{1}$0] show the most amazing behavior in the magnetic field, the data for both are compared to each other in FIGS. 9a) and 9b) for the two field strengths of H=0.02 T and 0.1 T. It has to be noted again that the scale of the y-axis has been changed between both figures, with the one in FIG. 9c) being more than three times larger than in FIG. 9a).

In both cases it is, however, seen that the magnetic field shifts the onset of Δn to higher temperatures and simultaneously increases Δn. This effect can be quantified for the [1 $\bar{1}$0] direction where more complete data on the magnetic field effects are available. In the insets to FIG. 9b) the data for H=0, 0.02, 0.063 and 0.1 T are summarized. Both, the transition to the non-birefringent state as well as Δn increase nonlinearly with the field strength which demonstrates the enormous sensitivity of the Δn with respect to an external magnetic field. The very pronounced differences in the data along the nominally orthogonal directions [1$\bar{1}$0] and [110] highlight the inequivalence between them which—as long as the system is in the tetragonal phase—should not be the case.

With respect to the above described possible device designs making use of ETO, an implementation may be a two-dimensional magneto-optical light modulator for e.g. signal processing. For this purpose the ETO film should be structured into isolated mesas, placed in a magnetic field and cooled to temperatures below $T_S$, i.e., close to room temperature. Depending on the orientation direction of the mesas, bright or dark spots appear which—in turn—can be reoriented to work purpose adapted. The operating temperatures are well accessible and the switching speed is fast with high stability. Another option for light modulation functions is the use of a rotating magnetic field or conversely to place the film on a rotating disk. With varying rotation angle, light is either transmitted or not. Another more sophisticated application is the detection of a magnetic field by the change of the birefringence, especially if the magnetic field is directed along the [1$\bar{1}$0] direction. In this case moderately small magnetic fields transform the ETO films into highly anisotropic optical materials.

It has to be pointed out that the observed effects take place in a compound which is nominally not magnetic including the substrate and sufficiently thick to exclude interfacial phenomena to be responsible for them.

REFERENCE NUMERALS 100 modulator
102 light beam
104 light beam
106 waveguide
108 waveguide
110 magnet
112 ETO
114 substrate
116 carrier
118 temperature controller
120 interface
122 controller
124 processor
126 memory
128 instructions
200 light source
202 detector
204 evaluation unit

The invention claimed is:

1. A magneto-optical light modulator for modulating light based on a physical property provided as an input to the modulator, the modulator comprising a substrate with a region of material comprising a film of $Eu_{(1-x)}Sr_{(x)}MO_3$, 0≤x<1, an optical waveguide adapted for directing light through the region of material and a first control unit, the M of the film of $Eu_{(1-x)}Sr_{(x)}MO_3$ being a metal selected from Ti, Hf, Zr and Th, the first control unit being adapted to
    maintain the region of material at a constant predefined temperature in case the physical property is an input magnetic field subject to the region of material or
    maintain the region of material subjected to a constant predefined magnetic field in case the physical property is an input temperature of the region of material,
    the light modulator being adapted to perform the modulation of the light using the birefringence of the region of material, the birefringence depending on the physical property.

2. The modulator of claim 1, further comprising
    a light source for generating the light to be directed through the region of material and
    a light detector adapted for determining the modulation of the light by determining the optical transparency of the region of material from the light directed through the region of material.

3. The modulator of claim 2, further comprising an evaluation unit adapted to determine from the determined transparency and the constant predefined temperature the field strength of the input magnetic field or to determine from the determined transparency and the constant predefined magnetic field the input temperature.

4. The modulator of claim 1, the substrate being a $SrTiO_3$ substrate.

5. The modulator of claim 1, further comprising
    a magnet for generating the input magnetic field and
    a second control unit coupled to a control input, the second control unit being adapted for controlling the generating of the input magnetic field with a desired field strength and/or field direction based on an input signal receivable via the control input.

6. The modulator of claim 1, the modulator comprising
    one or more of the substrates carrying a plurality of the regions of the material, the regions being spatially separated from each other, the optical waveguide being adapted for directing the light through the separated regions of the material,
    a magnet for generating the input magnetic field with a constant predefined field strength and/or field direction relative to the modulator.

7. The modulator of claim 6, further comprising
    a light source for generating the light to be directed through the regions of material,
    a light detector adapted for determining the modulation of the light by determining the optical transparency of each region of material from the light directed through said region of material,
    an evaluation unit adapted to determine from the determined transparencies one or more binary data values encoded using two different crystallographic orientations of the $Eu_{(1-x)}Sr_{(x)}MO_3$ in the regions, the two crystallographic orientations being relative to the modulator.

8. The modulator of claim 1, the Eu(1-x)Sr(x)MO3 being single crystalline, the input magnetic field and the constant magnetic field being oriented along the direction of the Eu(1-x)Sr(x)MO3 and/or the constant magnetic field being larger than 0.1 T and/or the constant temperature being in between 100K and 280K, light generated by the light source having an optical wavelength in between 400 nm and 700 nm.

9. A magnetic field sensor, the sensor comprising the modulator of claim 3.

10. A temperature sensor, the sensor comprising the modulator of claim 3.

11. A signal processor, the processor comprising the modulator of claim 5.

12. A memory device, the memory device comprising the modulator of claim 6.

13. A memory device for storing one or more binary data values, the memory device comprising one or more substrates with a plurality of regions of material, each region of material comprising a film of $Eu_{(1-x)}Sr_{(x)}MO_3$, $0 \leq x < 1$, the M of the film of $Eu_{(1-x)}Sr_{(x)}MO_3$ being a metal selected from Ti, Hf, Zr and Th, the regions being spatially separated from each other, the $Eu_{(1-x)}Sr_{(x)}MO_3$ being single crystalline, the one or more binary data values being encoded in the regions using two different crystallographic orientations of the $Eu_{(1-x)}Sr_{(x)}MO_3$ in the regions, the two crystallographic orientations being relative to the device.

14. A reader for reading the memory device of claim 13, the reader comprising a magnet generating a magnetic field at a readout zone of the reader, the magnetic field having a constant magnetic field strength and a constant field direction with respect to the device, the reader further comprising a processor and a memory, the memory comprising instructions, wherein execution of the instructions by the processor causes the reader to:
   determine in the readout zone the optical transparencies of the regions along a predefined constant direction relative to the device,
   determine from the determined transparencies the binary data values encoded in the regions.

15. A method for reading a memory device storing one or more binary data values, the memory device comprising a one or more substrates with a plurality of regions of material, each region of material comprising a film of $Eu_{(1-x)}Sr_{(x)}MO_3$, $0 \leq x < 1$, the M of the film of $Eu_{(1-x)}Sr_{(x)}MO_3$ being a metal selected from Ti, Hf, Zr and Th, the regions being spatially separated from each other, the $Eu_{(1-x)}Sr_{(x)}MO_3$ being single crystalline, the one or more binary data values being encoded in the regions using two different crystallographic orientations of the $Eu_{(1-x)}Sr_{(x)}MO_3$ in the regions, the two crystallographic orientations being relative to the device, a reader comprising a magnet generating a magnetic field at a readout zone of the reader, the magnetic field having a constant magnetic field strength and a constant field direction with respect to the device, the method comprising:
   determining, by the reader, in the readout zone the optical transparencies of the regions along a predefined constant direction relative to the device,
   determining, by the reader, from the determined transparencies the one or more binary data values encoded in the regions.

16. A computer program product comprising computer executable instructions to perform the method as claimed in claim 15.

17. The modulator of claim 1, wherein the optical waveguide is adapted for directing light through the region of material and an underlying substrate.

* * * * *